(12) United States Patent
Harris et al.

(10) Patent No.: US 8,149,000 B2
(45) Date of Patent: Apr. 3, 2012

(54) DETECTING CLOSURE OF AN ELECTRONIC DEVICE USING CAPACITIVE SENSORS

(75) Inventors: Ian F. Harris, Kings Park, NY (US); Drew J. Dutton, Austin, TX (US); Kenneth W. Gay, Tucson, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 205 days.

(21) Appl. No.: 11/870,529

(22) Filed: Oct. 11, 2007

(65) Prior Publication Data

US 2009/0058429 A1   Mar. 5, 2009

Related U.S. Application Data

(60) Provisional application No. 60/969,329, filed on Aug. 31, 2007.

(51) Int. Cl.
   *G01R 27/26* (2006.01)
(52) U.S. Cl. ...................................................... 324/661
(58) Field of Classification Search .................. 324/661
   See application file for complete search history.

(56) References Cited

U.S. PATENT DOCUMENTS

| | | | |
|---|---|---|---|
| 5,606,303 A | 2/1997 | Suski | |
| 5,612,520 A | 3/1997 | Toedtman et al. | |
| 6,178,818 B1 | 1/2001 | Plochinger | |
| 6,377,009 B1 * | 4/2002 | Philipp | 318/468 |
| 6,630,922 B2 * | 10/2003 | Fishkin et al. | 345/156 |
| 6,789,429 B2 | 9/2004 | Pinto et al. | |
| 7,075,781 B2 | 7/2006 | Peng | |
| 7,151,528 B2 * | 12/2006 | Taylor et al. | 345/168 |
| 7,265,542 B2 | 9/2007 | Hrubes | |
| 7,291,940 B2 * | 11/2007 | Bruwer | 307/140 |
| 7,325,457 B2 | 2/2008 | Fujimori et al. | |
| 7,557,312 B2 * | 7/2009 | Clark et al. | 200/5 A |
| 2003/0085679 A1 * | 5/2003 | Bledin et al. | 318/264 |
| 2004/0266253 A1 * | 12/2004 | Nakagawa | 439/488 |
| 2005/0152106 A1 | 7/2005 | Coster et al. | |
| 2006/0060762 A1 | 3/2006 | Chan et al. | |
| 2008/0042701 A1 | 2/2008 | Weiss et al. | |
| 2009/0015400 A1 * | 1/2009 | Breed | 340/539.22 |
| 2009/0323269 A1 * | 12/2009 | Iwata | 361/679.09 |

FOREIGN PATENT DOCUMENTS

TW   345633   11/1998

OTHER PUBLICATIONS

Taiwanese Office Action, U.S. Appl. No. 097133503, issued Feb. 21, 2011 (and conveyed Mar. 10, 2011); 9 pages.

* cited by examiner

*Primary Examiner* — Thomas F. Valone
(74) *Attorney, Agent, or Firm* — Meyertons Hood Kivlin Kowert & Goetzel, P.C.; Jeffrey C. Hood; Joel L. Stevens

(57) ABSTRACT

System and method for determining closure of an electronic device. The electronic device may include a top portion and a bottom portion, and may be connecting via a hinge or other closing mechanism. The top portion and/or the bottom portion may include one or more capacitive sensors which provide signals corresponding to physical contact and a controller coupled to the one or more capacitive sensors. The controller may operate to receive the signals from the one or more capacitive sensors, determine if the electronic device has been closed based on the received signals, and initiate a sequence of events corresponding to the closure of the electronic device. The sequence of events may result in the device entering a low power state.

16 Claims, 2 Drawing Sheets

DETECTING CLOSURE OF AN ELECTRONIC DEVICE USING CAPACITIVE SENSORS

PRIORITY INFORMATION

This application claims benefit of priority of U.S. provisional application Ser. No. 60/969,329 titled "Detecting Closure of an Electronic Device Using Capacitive Sensors" filed Aug. 31, 2007, whose inventors are Ian F. Harris, Drew J. Dutton, and Kenneth W. Gay which is hereby incorporated by reference in its entirety as though fully and completely set forth herein.

FIELD OF THE INVENTION

The present invention relates to the field of electronic devices, and more particularly to a method for detecting closure of an electronic device using capacitive sensors.

DESCRIPTION OF THE RELATED ART

Some electronic devices, such as laptop or mobile computers, include a closing system. For example, many devices include a display screen which folds onto a user interface portion (e.g., the keyboard of a laptop or mobile phone, among others). A common solution to detection of lid closure for these devices is a mechanical switch. However, these switches typically add cost to the manufacturing of the device, the location of the mechanical switch may interfere with other uses of the location (e.g., other switches or buttons on the device), and may present electrostatic discharge risks for the device. Other detection methods include using magnetic sensors; however, use of these sensors is usually not a cost efficient solution as they require a separate switch device. As a result, improvements in detections of lid-closures in electronic devices are desired.

SUMMARY OF THE INVENTION

Various embodiments are described of an electronic device with capacitive sensors for detecting lid closure.

The electronic device may be any type of electronic device which folds or closes. In other words, the electronic device may include a lid and/or a top portion and a bottom portion that close together. For example, the electronic device may be a mobile device such as a cellular telephone or smart phone. Alternatively, the electronic device may be a portable computer such as a laptop.

As indicated, the electronic device may include a top portion and a bottom portion. The top portion may include a display and the bottom portion may include a user interface portion (e.g., including a keyboard and/or trackpad, among others), and the top portion may close over the bottom portion. When the electronic device is opened, the top portion and the bottom portion may not be in contact (other than the folding part of the electronic device); when the electronic device is closed, the top portion and the bottom portion may be in contact or in "full contact" where the interior of the top portion and the bottom portion cannot be viewed and the electronic device takes on a smaller and more mobile configuration.

Typically, when the electronic device is closed, it is not in use. As a result, it is generally desirable to put the device in a sleep state when the device is closed (i.e., when the lid and the body of the electronic device come in contact). According to various embodiments described herein, the top portion and/or the bottom portion of the electronic device may include one or more capacitive sensors.

The capacitive sensor(s) may have a transmitter trace (e.g., a metal trace of a printed circuit board) which is connected to an excitation source (e.g., from an excitation signal, possibly using 250 kHz, among other values). An electric field may form between the transmitter trace and a receiver trace. The field strength at the receiver may be measured and/or transmitted to signal processing/controller. In one embodiment, the capacitance changes may be measured by an on-chip sigma-delta analog to digital converter (or other analog to digital converter) which may provide resulting data to a controller of the electronic device. Note that these particular values and connections of the capacitive sensor are exemplary only, and that other configurations and detections are envisioned. For example, a digital implementation using frequency shifts may be used as an alternative.

The capacitance of the sensor may vary according to various stimuli, e.g., contact or presence of a human (e.g., finger), physical contact (e.g., when the electronic device closes), etc. In some embodiments, where a capacitive sensor is in the interior portion of the electronic device when it is closed (e.g., on the face of the interior of the top portion or the bottom portion), a strip of material may be added to the corresponding portion on the alternate face to ensure accurate sensing of a closing event. For example, where the top portion includes a capacitive sensor, the bottom portion may include material at a position, such that when the electronic device is closed, the capacitance of the capacitive sensor changes due to the presence of the material. In other words, when the electronic device is closed, the capacitive sensor and the material may be proximate to each other, meaning that the capacitive sensor has a different capacitance based on the presence of the material. Similar remarks apply to sensors on the bottom portion and material on the top portion. In one embodiment, the bottom portion and/or the top portion may be covered in such a material. The material may be any type of substance or polymer which affects the capacitive sensors in a predictable and unique (from other events occurring to the electronic device) manner. For example, in one embodiment, the material may affect the capacitive sensor in such a way that it responds in a manner similar to human touch. In various embodiments, the material may be a particular plastic or polymer, metal (composite, magnetic, or other type of metal), and/or other material.

Alternatively, or additionally, capacitive sensors may be paired such that they come within close proximity when the electronic device is closed. Thus, the presence of another capacitive sensor may affect the capacitance of the capacitive sensor in a predictable manner. However, in one embodiment, the capacitive sensor may be separated, such that it only becomes a capacitive sensor when the electronic device is closed. For example, the transmitter trace and the receiver trace may be separated (i.e., on different portions of the electronic device) when the device is opened, but may form a capacitive sensor when the device is closed (due to the two traces, transmitter and receiver, coming into proximity, such that the transmitter's electric field is detected by the receiver. Thus, various configurations of the one or more capacitive sensors of the electronic device are envisioned.

Note that, in some embodiments, the capacitive sensors may be used specifically for detecting closure of the electronic device. However, some or all of the capacitive sensors may be used as human interface devices (e.g., buttons, sliders, touchpads, etc.) of the electronic device, but may be additionally used to detect closure of the electronic device. Thus, in one embodiment, detection of closure of the electronic device 100 may be performed without additional sensors by utilizing extant capacitive sensors (possibly used as for human interfaces) of the electronic device.

The electronic device (e.g., the controller component of the electronic device) may receive signals from one or more capacitive sensors indicative of various stimuli and may determine (e.g., according to hardware or software algorithms) whether the electronic device has been closed based on the signals. For example, to reduce or eliminate occurrence of false detection of device closure, the electronic device may receive signals from multiple capacitive sensors and only initiate a sequence of events (based on a detection of device closure) if all (or a majority) of the signals indicate a device closure. Thus, where a single capacitive sensor indicates a closure from a false stimuli (e.g., a user touching the sensor), the electronic device may not detect a lid closure because other sensors did not also transmit signals indicating a lid closure. However, multiple sensors may not be necessary in certain configurations. For example, following descriptions above where a material is used, lid closure may result in a unique signal which cannot be (or cannot be easily) reproduced during normal use. Thus, one or more sensors may be used to detect device closure, according to various embodiments.

After detection of lid closure, the electronic device (e.g., a controller of the electronic device) may initiate a sequence of events based on the closure of the device. For example, the electronic device may perform a sequence of events which results in the device entering a low power state and/or turning off a display of the electronic device. In one embodiment, the sequence of events may result in the device (e.g., a laptop) entering a "sleep" state.

BRIEF DESCRIPTION OF THE DRAWINGS

A better understanding of the present invention can be obtained when the following detailed description of the preferred embodiment is considered in conjunction with the following drawings, in which.

Figure 1:
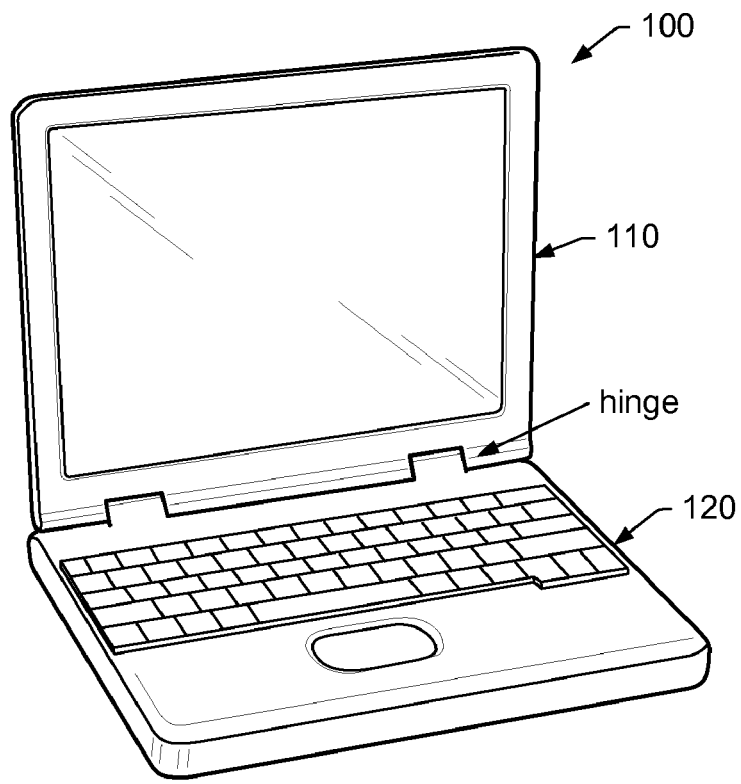
FIG. 1 illustrates an exemplary device according to one embodiment.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS
OF THE INVENTION

The following is a glossary of terms used in the present application:

Memory Medium—Any of various types of memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Figure 2:
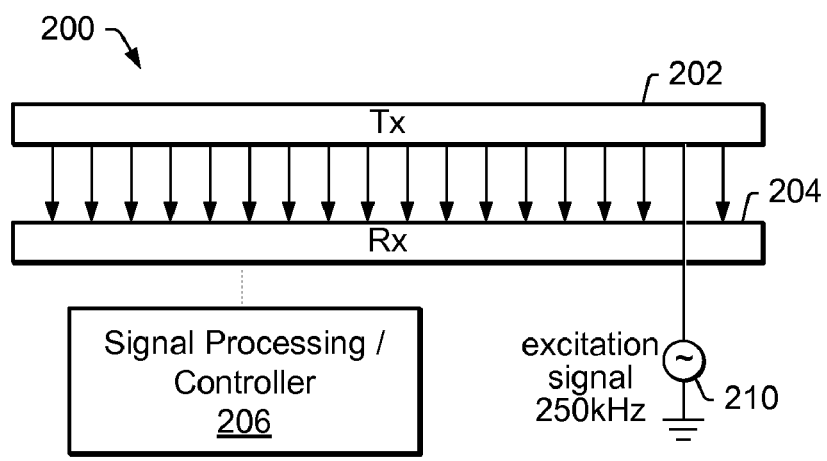
FIG. 2 illustrates an exemplary capacitive sensor(s) for detecting lid closure of a device according to one embodiment.

FIGS. 1 and 2—Exemplary Electronic Device with Capacitive Sensor(s)

FIG. 1 illustrates an exemplary electronic device 100 according to one embodiment. The electronic device 100 may be any type of electronic device which folds or closes. In other words, the electronic device 100 may include a lid and/or a top portion and a bottom portion that close together. For example, the electronic device 100 may be a mobile device such as a cellular telephone or smart phone. Alternatively, the electronic device 100 may be a portable computer such as a laptop (as shown in FIG. 1). The above-described electronic devices are exemplary only and any device for which lid closure is desirable is envisioned.

As shown in FIG. 1, the electronic device 100 may include a top portion 110 and a bottom portion 120, where the top portion and the bottom portion are connected using a hinge connected to both the top portion and the bottom portion. As shown, the top portion 110 may include a display and the bottom portion 120 may include a user interface portion (e.g., including a keyboard and/or trackpad, among others), and the top portion may close over the bottom portion. When the electronic device 100 is opened, the top portion 110 and the bottom portion 120 may not be in contact (other than the folding part of the electronic device 100); when the electronic device 100 is closed, the top portion 110 and the bottom portion 120 may be in contact or in "full contact" where the interior of the top portion and the bottom portion cannot be viewed and the electronic device takes on a smaller and more mobile configuration.

Typically, when the electronic device is closed, it is not in use. As a result, it is generally desirable to put the device in a sleep state when the device is closed (i.e., when the lid and the body of the electronic device come in contact). According to various embodiments described herein, the top portion 110 and/or the bottom portion 120 of the electronic device 100 may include one or more capacitive sensors.

For example, the electronic device 100 may include one or more capacitive sensors such as the capacitive sensor 200 shown in FIG. 2. As shown, the capacitive sensor may have a transmitter trace 202 (e.g., a metal trace of a printed circuit board) which is connected to an excitation source (e.g., from excitation signal 210, possibly using 250 kHz, among other values). An electric field may form between the transmitter trace 202 and the receiver trace 204, as indicated by the arrows shown in FIG. 2. As also shown, the field strength at the receiver may be measured and/or transmitted to signal processing/controller 206. In one embodiment, the capacitance changes may be measured by an on-chip sigma-delta analog to digital converter (or other analog to digital converter) which may provide resulting data to a controller of the electronic device 100 (e.g., the controller 206). Note that these particular values and connections of the capacitive sensor are exemplary only, and that other configurations and detections are envisioned.

The capacitance of the sensor 200 may vary according to various stimuli, e.g., contact or presence of a human (e.g., finger), physical contact (e.g., when the electronic device 100 closes), etc. In some embodiments, where a capacitive sensor is in the interior portion of the electronic device 100 when it is closed (e.g., on the face of the interior of the top portion or the bottom portion), a strip of material may be added to the corresponding portion on the alternate face to ensure accurate sensing of a closing event. For example, where the top portion 110 includes a capacitive sensor, the bottom portion 120 may include material at a position, such that when the electronic device 100 is closed, the capacitance of the capacitive sensor changes due to the presence of the material. In other words, when the electronic device 100 is closed, the capacitive sensor and the material may be proximate to each other, meaning that the capacitive sensor has a different capacitance based on the presence of the material. Similar remarks apply to sensors on the bottom portion and material on the top portion. In one embodiment, the bottom portion and/or the top portion may be covered in such a material. The material may be any type of substance or polymer which affects the capacitive sensors in a predictable and unique (from other events occurring to the electronic device) manner. For example, in one embodiment, the material may affect the capacitive sensor in such a way that it responds in a manner similar to human touch. In various embodiments, the material may be a particular plastic or polymer, metal (composite, magnetic, or other type of metal), and/or other material.

Alternatively, or additionally, capacitive sensors may be paired such that they come within close proximity when the electronic device 100 is closed. Thus, the presence of another capacitive sensor may affect the capacitance of the capacitive sensor in a predictable manner. However, in one embodiment, the capacitive sensor may be separated, such that it only becomes a capacitive sensor when the electronic device is closed. For example, the transmitter trace and the receiver trace may be separated (i.e., on different portions of the electronic device 100) when the device is opened, but may form a capacitive sensor when the device is closed (due to the two traces, transmitter and receiver, coming into proximity, such that the transmitter's electric field is detected by the receiver. Thus, various configurations of the one or more capacitive sensors of the electronic device 100 are envisioned.

Note that, in some embodiments, the capacitive sensors may be used specifically for detecting closure of the electronic device 100. However, some or all of the capacitive sensors may be used as human interface devices (e.g., buttons, sliders, touchpads, etc.) of the electronic device 100, but may be additionally used to detect closure of the electronic device 100. Thus, in one embodiment, detection of closure of the electronic device 100 may be performed without additional sensors by utilizing extant capacitive sensors (possibly used as for human interfaces) of the electronic device 100.

The electronic device 100 (e.g., the controller component 206 of the electronic device 100) may receive signals from one or more capacitive sensors indicative of various stimuli and may determine (e.g., according to hardware or software algorithms) whether the electronic device 100 has been closed based on the signals. For example, to reduce occurrence of false detection of device closure, the electronic device 100 may receive signals from multiple capacitive sensors and only initiate a sequence of events (based on a detection of device closure) if all (or a majority) of the signals indicate a device closure. Thus, where a single capacitive sensor indicates a closure from a false stimuli (e.g., a user touching the sensor), the electronic device 100 may not detect a lid closure because other sensors did not also transmit signals indicating a lid closure. However, multiple sensors may not be necessary in certain configurations. For example, following descriptions above where a material is used, lid closure may result in a unique signal which cannot be (or cannot be easily) reproduced during normal use. Thus, one or more sensors may be used to detect device closure, according to various embodiments.

After detection of lid closure, the electronic device 100 (e.g., the controller 206 of the electronic device 100) may initiate a sequence of events based on the closure of the electronic device 100. For example, the electronic device 100 may perform a sequence of events which results in the electronic device 100 entering a low power state and/or turning off a display of the electronic device 100. In one embodiment, the sequence of events may result in the electronic device 100 (e.g., a laptop) entering a "sleep" state.

Figure 3:
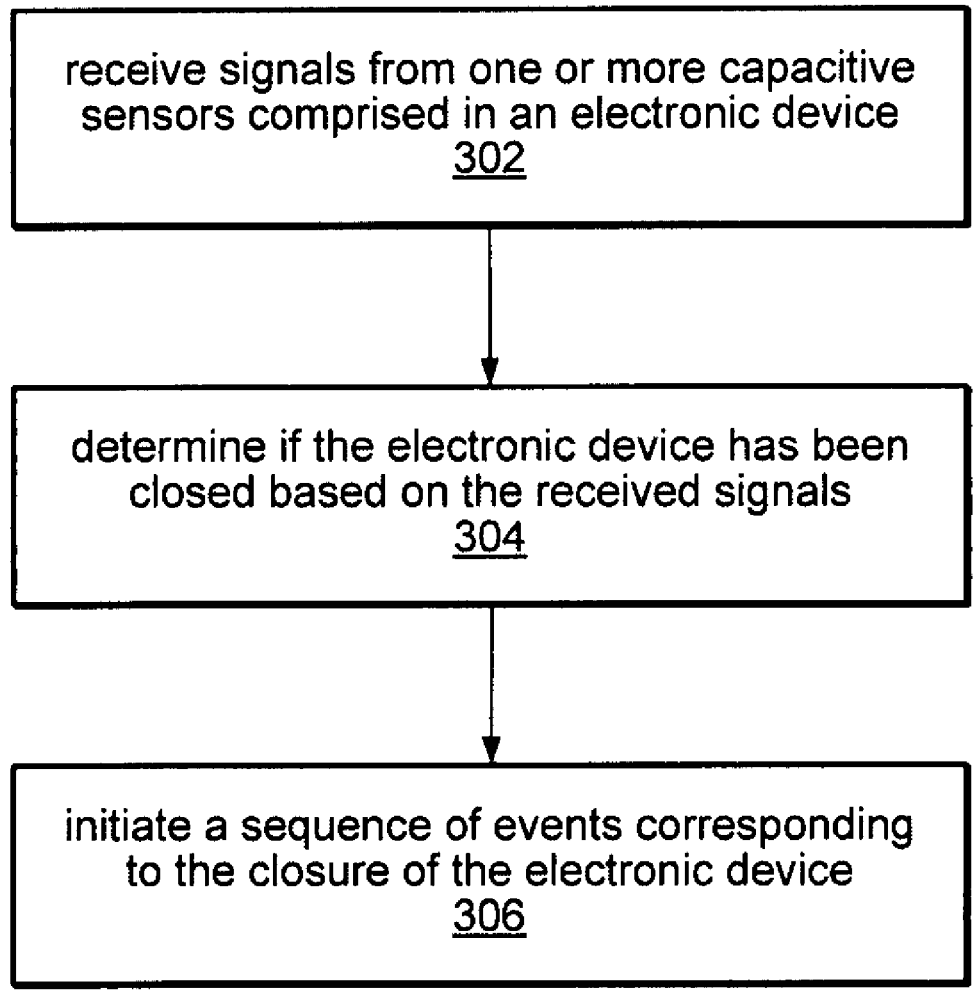
FIG. 3 is a flowchart diagram illustrating one embodiment of a method for detecting lid closure of an electronic device using capacitive sensor(s).

FIG. 3—Exemplary Method for Detecting Lid Closure

FIG. 3 illustrates a method for detecting lid closure of an electronic device using capacitive sensors. The method shown in FIG. 3 may be used in conjunction with any of the computer systems or devices shown in the above Figures, among other devices. In various embodiments, some of the method elements shown may be performed concurrently, performed in a different order than shown, or omitted. Additional method elements may also be performed as desired. As shown, this method may operate as follows.

In 302, signals may be received from one or more capacitive sensors in an electronic device. In one embodiment, the signals may be received by a controller (or micro-controller of the electronic device. Note that the signals may have been processed by various elements (e.g., analog/digital converters, etc.) before being transmitted to the controller.

In one embodiment, the electronic device may include a top portion and a bottom portion. the top portion may comprise a display portion and the bottom portion may comprise an input portion (e.g., including a keyboard and/or mouse pad). Note that the display portion may also allow for input, e.g., using one or more touch screens. The electronic device may be operable to close such that the top portion and the bottom portion of the electronic device come in contact (or come close to contact).

In some embodiments, the signals may be received from a plurality of capacitive sensors which may be distributed across the top portion and/or the bottom portion of the electronic device. In one embodiment, capacitive sensors may be paired such that they come in close proximity (i.e., affect one another's measured capacitance) when the electronic device is closed. However, in some embodiments, the capacitive sensors may only be distributed across one portion of the electronic device (e.g., the bottom portion of the electronic device). As indicated above, the capacitive sensors may be paired with a material on the corresponding side (e.g., where a capacitor on the bottom portion comes in proximity with the material when the device is closed) such that the material affects the capacitance of the sensor in predictable and/or unique way.

In various embodiments, the capacitive sensor(s) may be designated specifically for detecting closure of the electronic device. However, in alternate embodiments, the one or more capacitive sensors may have other uses, e.g., as human interface devices, but may allow for detection of closure of the electronic device as additional functionality. For example, at least one of the capacitive sensors may be used as a touch interface, e.g. of a display or a mouse/touch pad of the electronic device.

Thus, signals from one or more capacitive sensor(s) of an electronic device may be received.

In 304, it may be determined (e.g., by the controller) if the electronic device has been closed based on the received signals. In one embodiment, one or more algorithms (e.g., software or hardware) may be used (e.g., by the controller) to determine if the device has been closed. For example, when the device is closed, the capacitance of the sensors may vary in a unique way, e.g., based on the material coming in proximity to the sensor(s). By using multiple capacitive sensors, false closure detection may be avoided. For example, the electronic device/controller may only detect a closure when signals from multiple sensors indicate the closure. In this embodiment, a closure detection may not be determined unless all or a majority of the sensors indicate a device closure, as desired.

In 306, a sequence of events may be initiated which correspond to the closure of the electronic device. For example, a shut down sequence may be initiated, a sequence of events for putting the device to sleep may be initiated, a sequence of events for turning off the display of the electronic device may be initiated, and/or other sequences may be initiated based on closure of the device.

Note that while embodiments described above relate to detection of closure of an electronic device, similar descriptions apply to detection of opening of an electronic device. For example, a change in capacitance of the sensors could easily be used (according to descriptions herein) to detect opening of the device. Correspondingly, similar to above, a sequence of events may be initiated to wake up the device, e.g., the reverse of those performed in 306.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A mobile computer, comprising:
a top portion, comprising a lid of the mobile computer;
a bottom portion, wherein the top portion and the bottom portion are connected using a hinge connected to both the top portion and the bottom portion, such that the top portion and the bottom portion come in full contact when the mobile computer is closed and do not come in full contact when the mobile computer is open, and wherein when closed, an interior of the top portion and the bottom portion cannot be viewed and the mobile computer takes on a smaller and more mobile configuration;
wherein the top portion and/or the bottom portion comprise:
one or more capacitive sensors which provide signals corresponding to physical contact; and
a controller coupled to the one or more capacitive sensors, wherein the controller is configured to:
receive the signals from the one or more capacitive sensors;
determine if the mobile computer has been closed based on the received signals from the one or more capacitive sensors; and
perform a sequence of events corresponding to the closure of the mobile computer in response to determining that the mobile computer has been closed, wherein the sequence of events results in the mobile computer entering a low power state.

2. The mobile computer of claim 1, wherein the mobile computer comprises a laptop computer, wherein the top portion comprises a display, and wherein the bottom portion comprises a keyboard.

3. The mobile computer of claim 1, wherein the top portion comprises at least one capacitive sensor of the one or more capacitive sensors.

4. The mobile computer of claim 3, wherein the bottom portion comprises a corresponding material for the at least one capacitive sensor, wherein the at least one capacitive sensor and the material are proximate to each other when the mobile computer is closed, and wherein the at least one capacitive sensor is operable to provide a unique signal when the device is closed due to the proximity of the material.

5. The mobile computer of claim 1, wherein the bottom portion comprises at least one capacitive sensor of the one or more capacitive sensors.

6. The mobile computer of claim 5, wherein the top portion comprises a corresponding material for the at least one capacitive sensor, wherein the at least one capacitive sensor and the material are proximate to each other when the mobile computer is closed, and wherein the at least one capacitive sensor is operable to provide a unique signal when the device is closed due to the proximity of the material.

7. The mobile computer of claim 1, wherein the top portion comprises a first capacitive sensor of the one or more capacitive sensors and the bottom portion comprises a second capacitive sensor of the one or more capacitive sensors, wherein the first capacitive sensor and the second capacitive sensor are proximate to each other when the mobile computer is closed, and wherein at least one of the first and the second capacitive sensor is operable to provide a unique signal when the device is closed due to the proximity of the corresponding first or second capacitive sensor.

8. The mobile computer of claim 1, wherein at least one of the one or more capacitive sensors comprises a human interface device.

9. The mobile computer of claim 1, wherein at least one of the one or more capacitive sensors comprises a touch interface.

10. A method for detecting closure of a mobile computer, comprising:
receiving signals from one or more capacitive sensors comprised in the mobile computer, wherein the signals correspond to detection of physical contact, wherein the mobile computer comprises a top portion and a bottom portion connected using a hinge, wherein the top portion comprises a lid of the mobile computer, wherein, when the mobile computer is closed, the top portion and the bottom portion are in full contact, an interior of the top portion and the bottom portion cannot be viewed, and the mobile computer takes on a smaller and more mobile configuration, and wherein, when the mobile computer is open, the top portion and the bottom portion are not in full contact;
determining if the mobile computer has been closed based on the received signals from the one or more capacitive sensors; and performing a sequence of events corresponding to the closure of the mobile computer in response to determining that the mobile computer has been closed, wherein the sequence of events results in the mobile computer entering a low power state.

11. The method of claim 10, wherein the mobile computer comprises a laptop computer.

12. The method of claim 10, wherein at least one of the one or more capacitive sensors are comprised in the top portion of the mobile computer.

13. The method of claim 10, wherein the at least one of the one or more capacitive sensors are comprised in the bottom portion of the mobile computer.

14. The method of claim 10, wherein at least one of the one or more capacitive sensors comprises a human interface device.

15. The method of claim 10, wherein at least one of the one or more capacitive sensors comprises a touch interface.

16. A mobile computer, comprising:
a top portion, comprising a lid of the mobile computer;
a bottom portion, wherein the top portion and the bottom portion are connected using a hinge connected to both the top portion and the bottom portion, such that the top portion and the bottom portion come in full contact when the mobile computer is closed and do not come in full contact when the mobile computer is open, and wherein when closed, an interior of the top portion and the bottom portion cannot be viewed and the mobile computer takes on a smaller and more mobile configuration;
wherein the top portion and/or the bottom portion comprise one or more capacitive sensors which provide signals corresponding to physical contact;
wherein the signals provided by the capacitive sensors are used to determine if the mobile computer has been closed.

* * * * *